United States Patent
Thourhout

(10) Patent No.: US 6,931,036 B2
(45) Date of Patent: Aug. 16, 2005

(54) DIGITALLY TUNABLE LASER

(75) Inventor: Dries Van Thourhout, Ghent (BE)

(73) Assignee: Lucent Technologies Inc., Murray Hill, NJ (US)

(*) Notice: Subject to any disclaimer, the term of this patent is extended or adjusted under 35 U.S.C. 154(b) by 21 days.

(21) Appl. No.: 10/396,185

(22) Filed: Mar. 25, 2003

(65) Prior Publication Data

US 2004/0190565 A1 Sep. 30, 2004

(51) Int. Cl.[7] .............................. H01S 3/30; H01S 3/10; H01S 3/08
(52) U.S. Cl. .......................................... 372/20; 372/92
(58) Field of Search .............................. 372/20, 92, 64, 372/98

(56) References Cited

U.S. PATENT DOCUMENTS

| | | | | |
|---|---|---|---|---|
| 5,136,671 A | * | 8/1992 | Dragone ....................... 385/46 |
| 5,373,516 A | * | 12/1994 | Glance et al. ................. 372/20 |
| 5,373,517 A | * | 12/1994 | Dragone et al. .............. 372/20 |
| 5,396,507 A | * | 3/1995 | Kaminow et al. ............. 372/20 |
| 5,504,609 A | * | 4/1996 | Alexander et al. ............ 398/91 |
| 5,576,881 A | * | 11/1996 | Doerr et al. ................. 359/333 |
| 5,881,079 A | * | 3/1999 | Doerr et al. .................. 372/20 |
| 6,243,402 B1 | * | 6/2001 | Doerr .......................... 372/20 |
| 6,359,912 B1 | * | 3/2002 | Doerr et al. ..................... 372/4 |
| 6,434,175 B1 | * | 8/2002 | Zah .............................. 372/20 |
| 6,594,049 B1 | * | 7/2003 | Brinkman et al. ............ 385/24 |
| 6,618,176 B2 | * | 9/2003 | Alexander et al. ............ 398/91 |
| 2004/0067006 A1 | * | 4/2004 | Welch et al. ................. 385/14 |

OTHER PUBLICATIONS

Besten et al., Dec. 2002, IEEE Photonic Technology Letters, vol. 14, No. 12.*

C.R. Doerr, et al., "40–Wavelength Rapidly Digitally Tunable Laser," IEEE Photonics Technology Letters, vol. 11, No. 11, Nov. 1999, pp. 1348–1350.

C.H. Joyner et al., "Low–Threshold Nine–Channel Waveguide Grating Router–Based Continuous Wave Transmitter," Journal of Lightwave Technology, vol. 17, No. 4, Apr. 1999.

J.H. denBesten et al., "An Integrated Coupled–Cavity 16–Wavelength Digitally Tunable Laser," IEEE Photonics Technology Letters, vol. 14, No. 12, Dec. 2002, pp. 1653–1655.

* cited by examiner

*Primary Examiner*—Don Wong
*Assistant Examiner*—Hung Tran Vy

(57) ABSTRACT

A wavelength selection and, optionally, amplification device that finds utility as an optical filter or laser and is realized using two waveguide grating routers with different free spectral range values.

8 Claims, 3 Drawing Sheets

DIGITALLY TUNABLE LASER

FIELD OF THE INVENTION

This invention relates generally to optical communications systems and, more specifically, to tunable wavelength elective elements such as tunable lasers and filters for use in optical communications systems.

BACKGROUND OF THE INVENTION

As wavelength division multiplexed (WDM) networks containing large numbers of wavelength channels are becoming more common, the need for multiwavelength sources is increasingly important. Multiwavelength sources, such as tunable lasers, have the ability to tune to different wavelengths either continuously over some allowable range or at discrete wavelength values. Since each channel in a WDM optical communication system operates at a distinct wavelength, multiwavelength sources are essential to relieve inventory and stockpiling issues associated with systems with a discrete source for each wavelength.

Fast tunable lasers with switching times smaller than 50 ns promise to be attractive components for next generation optical networks. A major class of tunable lasers is formed by integrating a gain section with one or multiple tunable grating sections. In such a laser, the wavelength is switched by injecting current into one or more of the grating sections. However, these lasers typically require that the tuning current be controlled within +/−25 $\mu$A in order to obtain accurate wavelength settings. This tends to inhibit fast tuning and/or limit wavelength accuracy. Temperature changes in the grating sections during the tuning cycle further complicates the operation of these devices.

Digitally tunable lasers are formed by integrating an amplifier array with a passive wavelength selective element such as an arrayed waveguide grating (AWG) router or a diffraction grating. In these devices, the wavelength is switched by turning respective amplifiers on or off. The operating wavelength is determined by the passive element and, unlike the fast tunable lasers previously mentioned, is virtually independent of the current through the amplifiers.

SUMMARY OF THE INVENTION

The invention comprises wavelength selection and, optionally, amplification device that finds utility as an optical filter or laser. In one embodiment, a digitally tunable laser produces high optical output power using a relatively small number of optical amplifiers.

An apparatus according to an embodiment of the present invention comprises two optical multiplexers having input ports coupled to respective wavelength selection elements and output ports coupled to a common output coupler; wherein each of said wavelength selection elements cooperates with a respective highly reflective surface to selectively provide respective wavelengths of light emanating therefrom; and said optical multiplexers have different respective free spectral ranges, common central channel wavelengths and equal wavelength channel spacing.

BRIEF DESCRIPTION OF THE DRAWINGS

The teachings of the present invention can be readily understood by considering the following detailed description in conjunction with the accompanying drawings, in which.

DETAILED DESCRIPTION OF THE INVENTION

The present invention will be generally described within the context of a laser. However, the teachings of the present invention are also applicable to optical filtering. Therefore, the present invention generally provides a wavelength selection device which provides an optical filtering function and, with optical amplification within a lasing cavity, a laser function.

Figure 1:
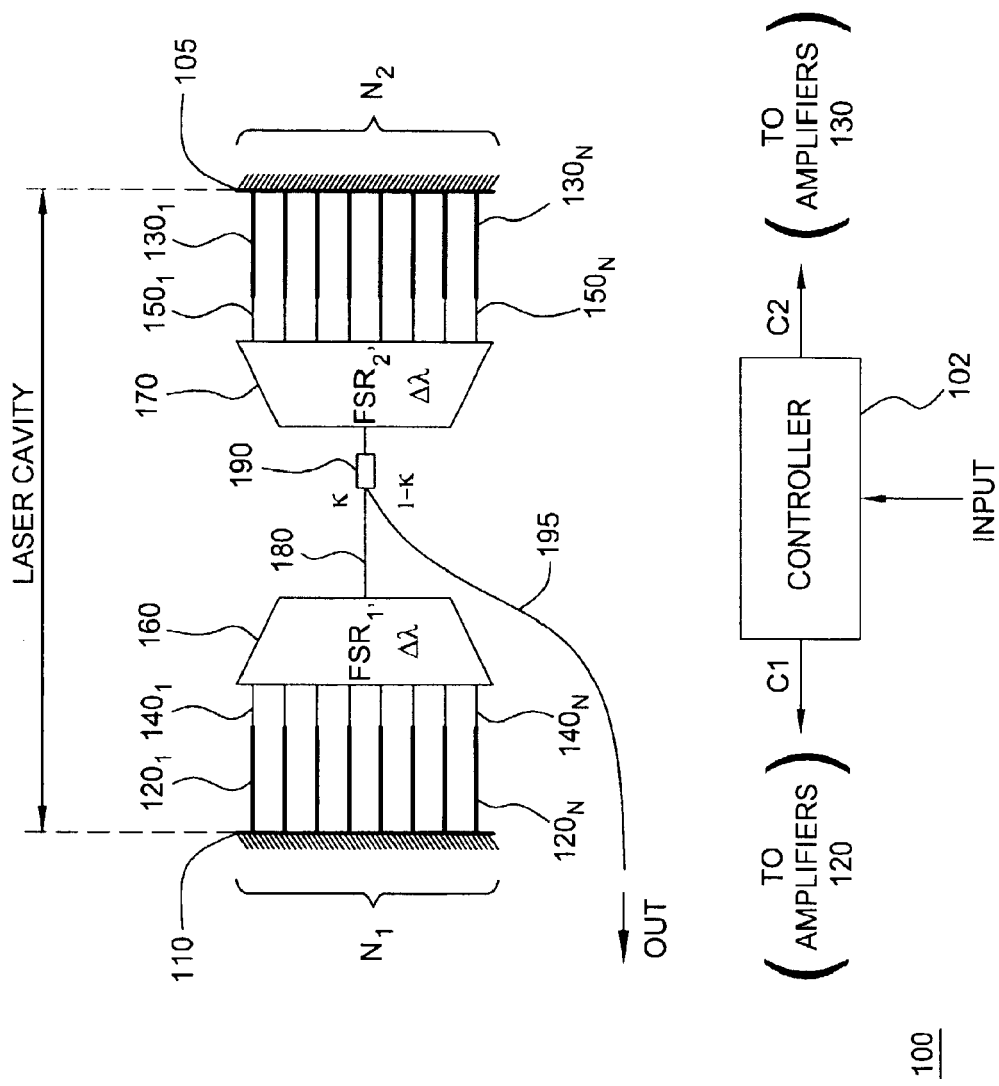
FIG. 1 depicts a schematic diagram of a digitally tunable laser according to an embodiment of the present invention.

FIG. 1 depicts a schematic diagram of a digitally tunable laser according to an embodiment of the present invention. The digitally tunable laser 100 of FIG. 1 resides within a laser cavity bounded by first 110 and second 105 highly reflective surfaces or mirrors and generally comprises two optical multiplexers providing output light to a common waveguide. Each of the optical multiplexers receives light from a respective highly reflective surface via waveguides (140 and 150) and associated amplifiers (120 and 130).

A first plurality of semiconductor optical amplifiers (SOAS) $120_1$ through $120_{N1}$ (collectively SOAs 120) cooperates with the first highly reflective surface 110 to provide optical amplification of respective wavelengths of light emanating therefrom. Each of a corresponding first plurality of waveguides $140_1$ through $140_{N1}$ operates to couple amplified optical energy from a respective SOA 120 to a respective input port of a first optical multiplexer 160. The first optical multiplexer 160 operates to multiplex the first plurality of amplified optical signals to produce a first multiplexed optical signal.

A second plurality of semiconductor optical amplifiers (SOAs) $130_1$ through $130_M$ (collectively SOAs 130) cooperates with the second highly reflective surface 110 to provide optical amplification of respective wavelengths of light emanating therefrom. Each of a corresponding second plurality of waveguides $150_1$ through $150_{N2}$ operates to couple amplified optical energy from a respective SOA 130 to a respective input port of a second optical multiplexer 170. The second optical multiplexer 170 operates to multiplex the second plurality of amplified optical signals to produce a second multiplexed optical signal.

Each of the optical multiplexers 160,170 illustratively comprise arrayed waveguide grating (AWG) based optical multiplexers. However, it is noted by the inventor that other types of optical multiplexers may be employed, such as diffraction grating based optical multiplexers, ring resonator based optical multiplexers and so on. Each of the optical multiplexers 160,170 in the AWG implementation comprises a series of input waveguides, a free space section, an array of arms having unequal lengths, a second free space section and one or more output waveguides. In one embodiment of the invention, a single output waveguide is utilized as a common central waveguide for both of the optical multiplexers. Each AWG is characterized by a central wavelength, common channel spacing and a respective free spectral range.

Each of the optical amplifiers 120, 130 illustratively comprise a doped section of waveguide with controllable optical transmissivity. A controller 102 provides electrical stimulus to the optical amplifiers 120 via control signals C1, and to the optical amplifiers 130 via control signals C2. Electrical stimulus provided to the optical amplifiers 120, 130 operates to cause all, some or individual ones of the amplifiers 120, 130 to provide corresponding gain or attenuation to optical energy passing therethrough. The controller 102 optionally receives an input signal INPUT from a user input device (not shown) or other source. In response, the controller 102 adapts the output control signals C1 and C2 in accordance with received input commands. The controller 102 comprises a processor, memory and input/output (I/O) circuitry. Programs stored within the controller memory are executed by the processor to process the input commands and generate thereby appropriate output control signals C1, C2. The I/O circuitry operates to interface the controller 102 to the optical amplifiers 120, 130 and the source of the input commands INPUT.

Specifically, the sections defining the optical amplifiers 120, 130 are optically active in that application of electrical energy will cause them to become transmissive to the flow of optical energy and further provide some additional amount of energy; these doped sections of waveguide are substantially opaque to the transmission of light if no control signal is applied. The specially doped sections thus may be considered to be optical amplifiers or gates depending upon whether or not they are activated, i.e., excited or not excited with electrical energy such as a bias current provided by a controller. The doped sections may be formed using standard techniques well known to those skilled in the art, including, but not limited to, metal organic vapor phase epitaxy.

The first amplifier array (first plurality of SOAs 120) is integrated with the first optical multiplexer 160, which has a respective free spectral range (FSR) denoted as $FSR_1$. The second amplifier array (SOAs 130) is integrated with the second optical multiplexer 170, which has a respective FSR denoted as $FSR_2$, where $FSR_1$ is not equal to $FSR_2$. Both optical multiplexers 160, 170 have the same central channel wavelength and equal channel spacing ($\Delta\lambda 1$) such that their respective passbands overlap. Where the two FSR values share no common integer divisors, the total free spectral range for the transfer from one of the amplifiers at the left side of the device to one of the amplifiers at the right size of the device is equal to the product FSR1×FSR2.

The operation of the digitally tunable laser comprises selectively applying electrical energy, such as a bias current, to the optical amplifiers 120, 130 such that specific optical pathways are created. Turning on the amplifiers of one amplifier array in combination with one of the amplifiers of the other array allows every channel within the total free spectral range to be reached.

The output light is directed to the output waveguide 195 upon extraction from the common waveguide 180 via an output coupler 190 optically cooperating with each of the multiplexers 160, 170. The coupling ratio κ of the output coupler 190 is selected such that the threshold current and the external efficiency of the laser 100 is optimized to maximize the output power for a given drive current. It is noted that the selection of the factor κ determines how much light is released by the laser and how much light is retained within the laser cavity. Those skilled in the art and informed by the teachings of the present invention will appreciate that the selection of the factor κ may be adapted to the particular requirements of the application to which the digitally tunable laser is employed. Generally speaking, κ is adapted to provide a maximum amount of output power at a minimum amount of input current.

Figure 2:
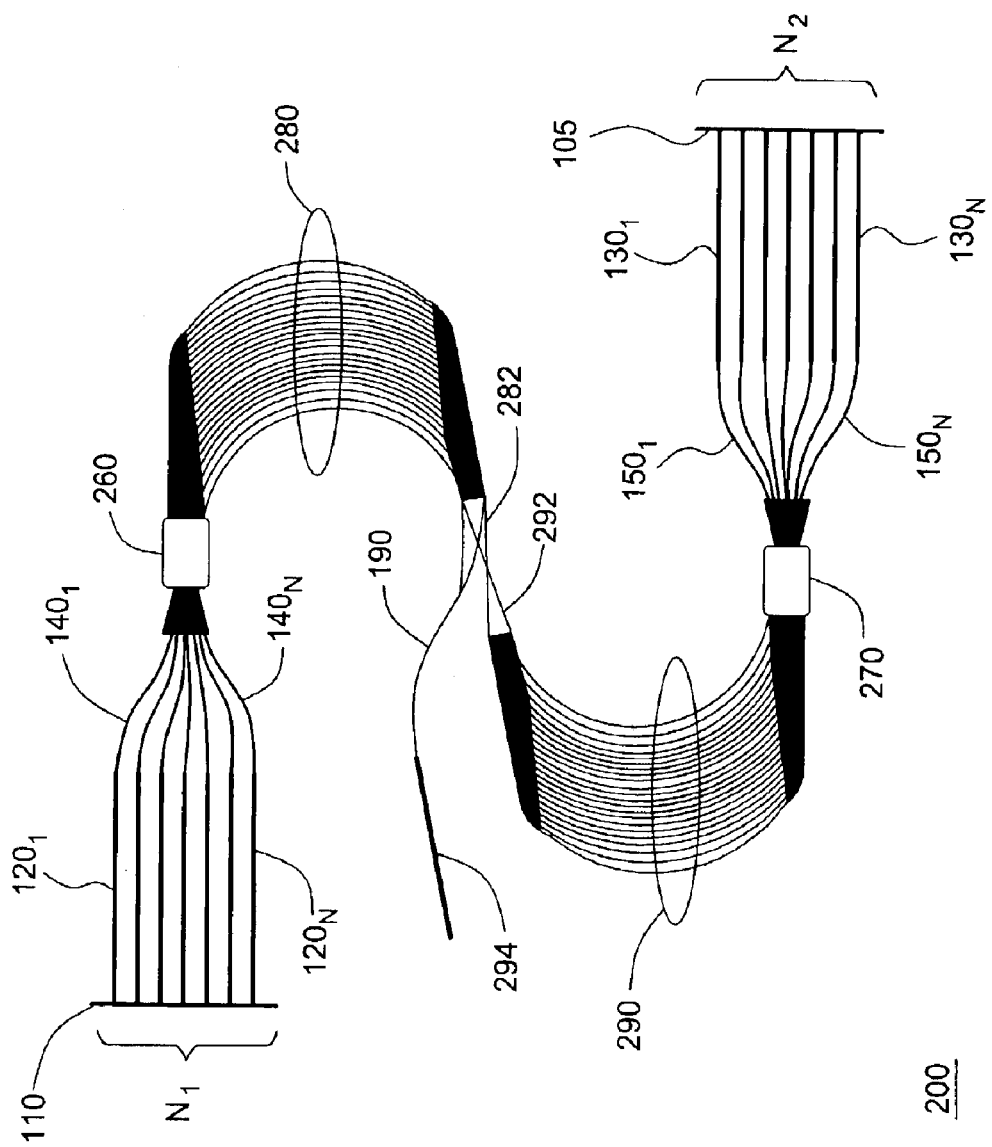
FIG. 2 depicts a graphical representation of a mask design for a $N_1 \times N_2$ digitally tunable laser according to an embodiment of the present invention.

FIG. 2 depicts a graphical representation of a mask design for a N1×N2 digitally tunable laser according to an embodiment of the present invention. That is, FIG. 2 depicts a mask layout suitable for realizing a digitally tuned laser such as described above with respect to FIG. 1. Specifically, as with the digitally tunable laser 100 of FIG. 1, the digitally tunable laser 200 of FIG. 2 depicts a first highly reflective surface 110 optically cooperating with a first array of optical amplifiers 120 which provide respective wavelength channels via respective waveguides 140 to an optical multiplexer. In the digitally tunable laser 200 of FIG. 2, the optical waveguides 140 cooperate with a first star coupler 260 which propagates the respective amplified wavelengths via a plurality of unequal length waveguide grating arms 280 to a second star coupler 282. Similarly, a second highly reflective surface 105 optically cooperates with a second array of optical amplifiers 130 to propagate respective amplified wavelength channels via a respective plurality of waveguides 150 to a third star coupler 270. The third star coupler 270 propagates the respective amplified wavelengths via a plurality of unequal length waveguide grating arms 290 to a fourth star coupler 292.

In one embodiment, an exemplary 56-channel digitally tunable laser is provided with N1=7 and N2=8. The free spectral range values are 700 GHz and 800 GHz for the upper (260) and lower (270) AWGs, respectively; and a channel spacing of 100 GHz is selected for both upper and lower AWGs.

The common output waveguide 190 is connected to the opposite edge of the Brillouin zone of the lower AWG 292. This configuration is equivalent to having a 3 dB coupler in between both devices with no additional space required. At the facet, the common output waveguide is angled to avoid reflections and an SOA 294 is added to further amplify the output power. The star couplers in the center of the device were tapered down to 4 $\mu$m, equivalent to the width of the entrance waveguides to the multiplexers, to select a single wavelength channel. It is important to note that, by the specific layout of the devices, the dispersion in both central star couplers work in opposite directions. Where this is not the case, it is appropriate to add a short single mode waveguide.

Figure 3:
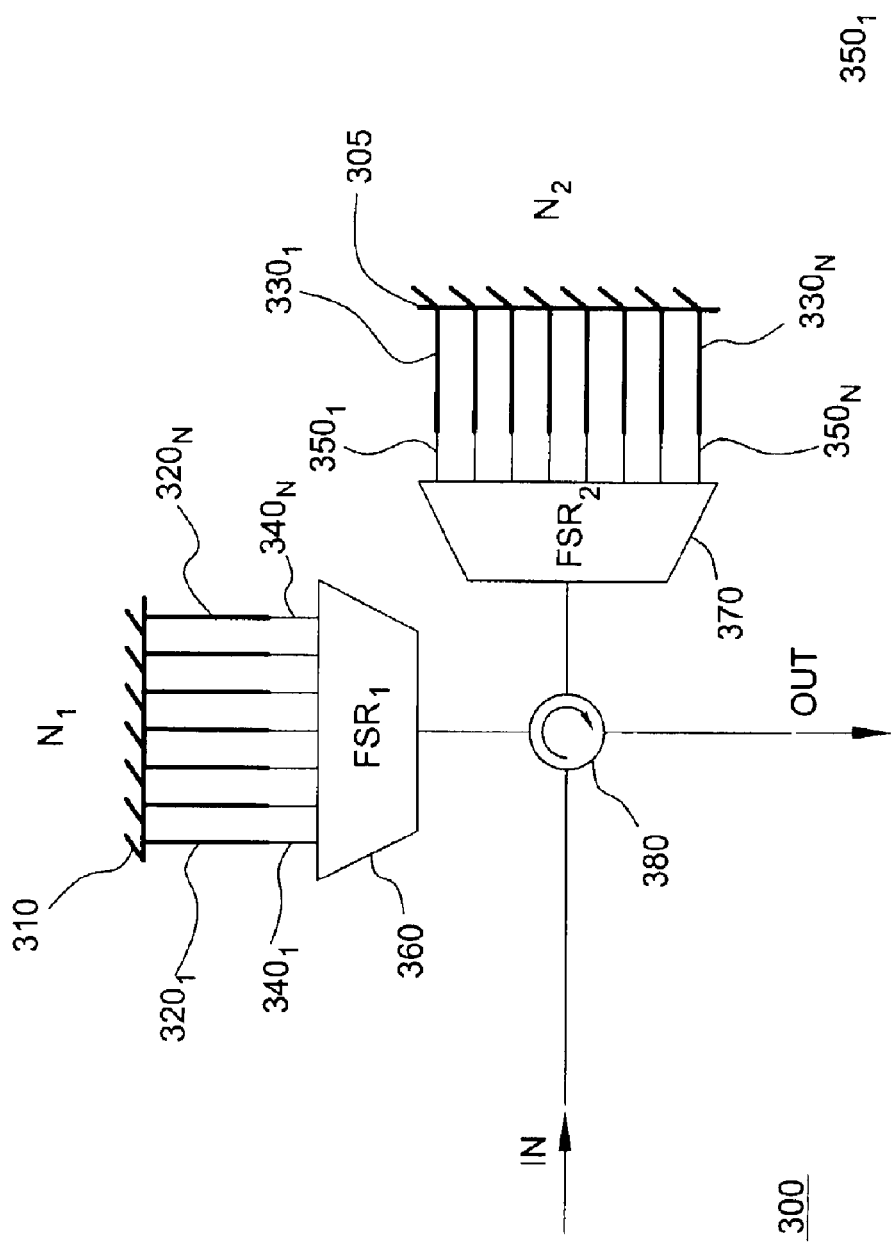
FIG. 3 depicts a schematic diagram of a digitally tunable and upgradeable filter according to an embodiment of the present invention.

FIG. 3 depicts another embodiment of the present invention to implement a digitally tunable and upgradeable filter. Specifically, as with the schematic representation 100 of FIG. 1 and the mask design 200 of FIG. 2, FIG. 3 depicts a first highly reflective surface 310 optically cooperating with a first array of optical amplifiers 320 which provide respective wavelength channels via respective waveguides 340 to an optical multiplexer 360. Similarly, a second highly reflective surface 305 optically cooperates with a second array of optical amplifiers 330 to propagate respective amplified wavelength channels via a respective plurality of waveguides 350 to a second optical multiplexer 370. Each multiplexer has a different FSR.

The multiplexers 360, 370 are connected through a circulator 380, which receives an input signal IN and produces an output signal OUT. This has several advantages; namely, that the central wavelength of both multiplexers can be tuned independently, smaller device size are realized along with higher yield results. The ability to upgrade also exists since the size of one device can be changed independently of the size of the other.

A completely integrated device can be fabricated to include the invention. The device can be implemented utilizing integrated circulators or by replacing the circulator 380 of FIG. 3 by two 3 dB-couplers. The couplers incur an additional on-chip loss of 9 to 12 dB since each coupler is passed two times. This extra loss is offset by the fact that fewer lossy fiber-chip transitions are required (two for the integrated case as compared to FIG. 3).

Advantageously, a digitally tunable laser according to the present invention may be fabricated using a smaller substrate and with fewer control paths (i.e., fewer SOAs and corresponding bias current sources). With respect to substrate size or surface area, by multiplying the free spectral range of the first and second optical multiplexers to produce a relatively high effective free spectral range, the much larger substrate size or area normally used to support a single optical multiplexer having such a high free spectral range is greatly reduced. With respect to control, the total number of SOAs, bias current sources and, generally, control paths and/or channels provided by the digitally tunable laser is equal to $N_1$ multiplied by $N_2$ (e.g., 56 in the $N_1=7$, $N_2=8$ embodiment discussed above). Thus, instead of having 56 signals produced using optical amplifiers, it is only necessary to produce 15 amplified signals (i.e., 7+8 to produce the same 56 channels). That is, whereas previous digitally tunable lasers required N controls, the digitally tunable laser of the present invention requires approximately the square root of N controls.

While multiple waveguide devices have been shown in which fewer controls are utilized, such devices do not utilize a common waveguide where all of the wavelengths are multiplexed together. Such a common waveguide (i.e, waveguide 180) avoids the need to extract power from the side of the optical multiplexer, where power tends to be much lower. Moreover, in any prior multiple waveguide devices, the channel spacing for each of the multiplexers was different. Specifically, the channel spacing of one multiplexer was adapted to the free spectral range of the other multiplexer. By contrast, the channel spacing of the present invention is equivalent in both multiplexers.

The above-described tunable laser is generally presented as a digitally tunable laser in which individual channels within a series of channels may be selected. It is noted that a continuous tuning function may be implemented by using temperature-based tuning techniques in which, for example, the optical properties of one or more the various components are adapted by varying the operating temperature of the component(s).

A wavelength selection device such as a tunable filter or laser according to the present invention generally comprises two highly reflective surfaces or mirrors in which two optical multiplexers are coupled to a common waveguide which provides a portion of their light as an output signal. Each of the optical multiplexers receives light from the highly reflective surfaces via a respective array of wavelength selection elements. In the case of a laser, the wavelength selection elements comprise amplifying elements. In the case of a filter, the wavelength selection elements comprise amplifying or non-amplifying elements. Non-amplifying wavelength selection elements are implemented using an array of controllable optical gates or switches, while amplifying wavelength selection elements are preferably implemented using an array of semiconductor optical amplifiers (SOAs), though a combination of optical gates/switches and amplifiers may be used. Turning on one of the amplifiers or gates of one array, in combination with one of the amplifiers or gates of the other array, permits every channel within the total device free spectral range to be reached. The output light is then extracted from the common waveguide.

Each of the optical multiplexers provides a respective plurality of multiplexed wavelength channels which are combined into a common channel to provide thereby an increased optical output power. Preferably, the two optical multiplexers comprise grating routers having different free spectral ranges such that for an N-channel device, both the number of required amplifiers and the number of required grating arms scale as the square root of N (where N is an integer greater than one).

In the case of a laser the highly reflective surfaces form a cavity and the laser is formed on a single substrate. In the case of a filter, the highly reflective surfaces do not need to form a cavity and the filter may be formed using one or more substrates.

In one embodiment, output optical power is directly extracted from at least one of the third and fourth free space regions proximate the output coupler structure through a higher diffraction order waveguide grating.

While various embodiments that incorporate the teachings of the present invention have been shown and described in detail herein, those skilled in the art can readily devise many other varied embodiments that still incorporate these teachings.

What is claimed is:

1. Apparatus, comprising:

two arrayed waveguide grating optical multiplexers having input ports coupled to respective wavelength selection elements and output ports coupled to a common output coupler, each optical multiplexer also comprising first and second free space regions coupled together by a waveguide grating array;

each of said wavelength selection elements cooperating with a respective highly reflective surface to selectively provide respective wavelengths of light emanating therefrom;

said optical multiplexer having different respective free spectral range, common central channel wavelengths and equal wavelength channel spacing.

2. The apparatus of claim 1, wherein:

said wavelength selective elements comprises a plurality of semiconductor optical amplifiers (SOAs) cooperating with said respective highly reflective surface to provide optical amplification of respective wavelengths of light emanating therefrom.

3. The apparatus of claim 2, further comprising:

a controller, for selectively introducing respective bias currents to said SOAs to select thereby wavelengths to be amplified.

4. The apparatus of claim 1, wherein:

said common output coupler comprises an output coupler having a coupling ratio k selected to maximize the output power of said laser.

5. The apparatus of claim 1, wherein respective passbands of said two free space regions overlap.

6. The apparatus of claim 1, wherein said apparatus operates as a laser.

7. The apparatus of claim 1, wherein said apparatus operates as an optical filter.

8. The apparatus of claim 1, wherein:

said apparatus operates as an optical filter; and said common output coupler comprises one of a circulator and a 3 dB coupler adapted to inject an optical signal to be filtered and to extract a filtered optical signal.

* * * * *